United States Patent [19]

Smith

[11] Patent Number: 4,701,957
[45] Date of Patent: Oct. 20, 1987

[54] DUAL MODE MUSIC INSTRUMENT PREAMPLIFIER

[76] Inventor: Randall C. Smith, 1317 Ross St., Petaluma, Calif. 94952

[21] Appl. No.: 935,270

[22] Filed: Nov. 26, 1986

[51] Int. Cl.$^4$ .............................................. H03G 3/00
[52] U.S. Cl. ...................................... 381/61; 84/1.19; 330/149
[58] Field of Search ...................... 381/61, 62, 63, 118, 381/120; 330/51, 149; 84/1.19, 1.16

[56] References Cited

U.S. PATENT DOCUMENTS

| | | | |
|---|---|---|---|
| 3,493,669 | 2/1970 | Elbrecht et al. | 84/1.16 |
| 3,663,735 | 5/1972 | Evans | 84/1.11 |
| 4,180,707 | 12/1979 | Moog | 381/61 |
| 4,211,893 | 7/1980 | Smith | 381/118 |
| 4,286,492 | 9/1981 | Claret | 84/1.19 |
| 4,446,440 | 5/1984 | Bell | 330/51 |
| 4,480,520 | 11/1984 | Gold | 84/1.16 |
| 4,495,640 | 1/1985 | Frey | 381/118 |
| 4,593,251 | 6/1986 | Smith | 330/51 |
| 4,644,289 | 2/1987 | Kennedy et al. | 84/1.16 |

Primary Examiner—Forester W. Isen
Attorney, Agent, or Firm—David B. Harrison

[57] ABSTRACT

A preamplifier circuit for enhancing sound generated by a musical instrument such as a guitar and which is converted into electrical signals includes an input, a passive high impedance input network connected to the input, a first preamplifier connected to the passive input network for non-distortion amplification of the electrical signals in a first mode of operation and for saturation distortion amplification of said electrical signals in a second mode of operation. A switch circuit enables switching between the first and second modes of operation. An overdrive amplifier bridges across the passive input network in response to the switch circuit for overdriving the first preamplifier thereby to cause saturation distortion amplification of the electrical signals. A shunt network may be switched across the output terminal to equalize output amplitude of the preamplifier circuit between the first and second modes of operation.

8 Claims, 4 Drawing Figures

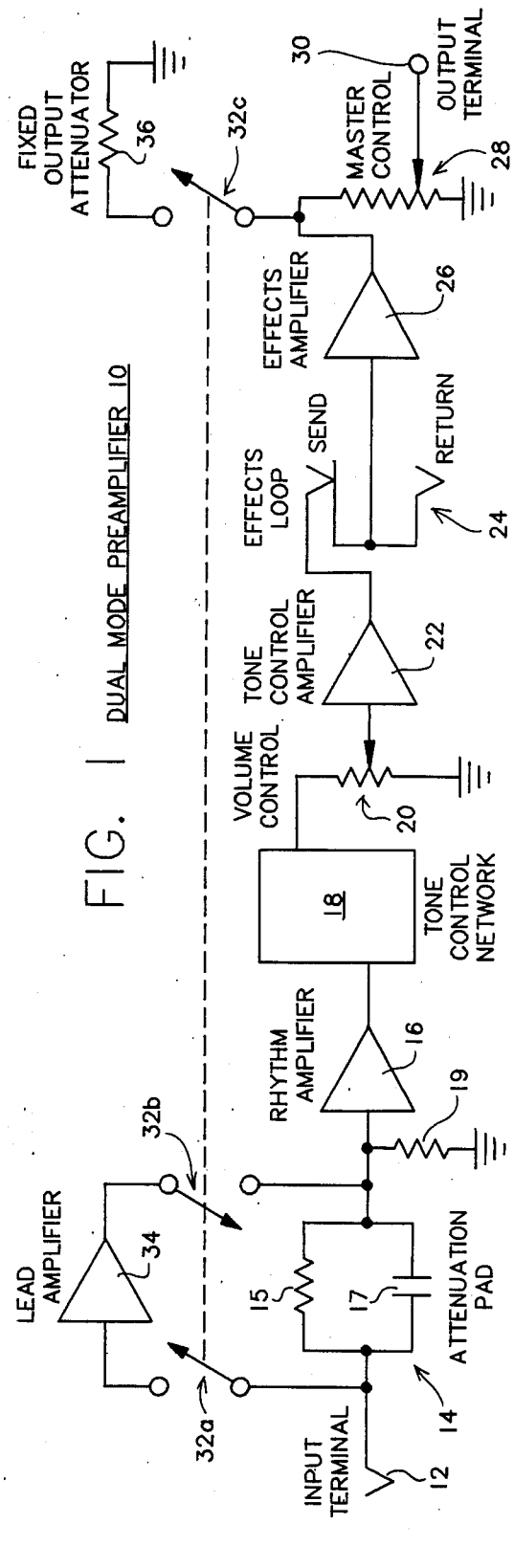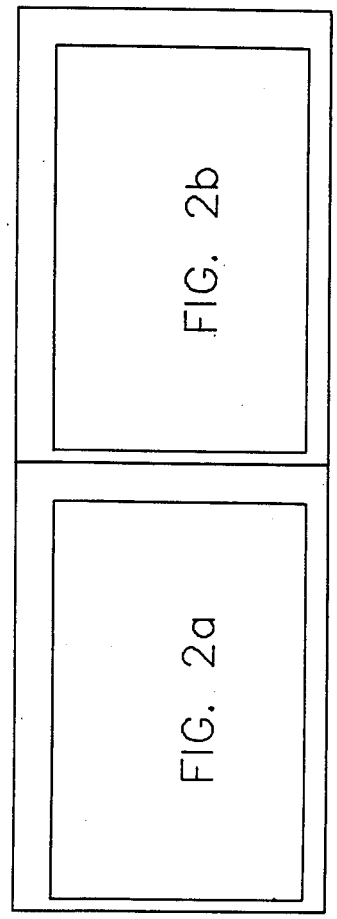

DUAL MODE MUSIC INSTRUMENT PREAMPLIFIER

FIELD OF THE INVENTION

The present invention relates to electronic amplifiers for musical instruments, particularly guitar. More specifically, the present invention provides with simplified circuitry dual signal processing characteristics: a linear mode for rhythm or chordal playing, and a saturation mode for lead or solo playing (where usually only one or two strings and notes at a time are played).

BACKGROUND OF THE INVENTION

The present inventor has successfully pioneered the dual mode preamplifier for electric guitar. His prior U.S. Pat. No. 4,211,893 (the disclosure of which is incorporated into this patent by reference) has heretofore come to define the state of the art, and has been embodied in a product line which has achieved significant commercial success and has since become recognized as a standard of excellence in the electric guitar amplifier field.

The dual mode amplifier described in the '893 patent offered a "solo enhancement" mode (i.e. the "lead" mode) which added massive amounts of carefully cultured harmonic distortion to simulate (and go beyond) the sounds produced by a power amplifier driven into extreme saturation clipping. The virtues of the '893 dual mode amplifier were several. First, although solo enhancement has as its origin the overdriven power section, the dual mode amplifier (being a preamplifier processing system rather than an overdriven power amplifier) was operable irrespective of playing output loudness. Second, the dual mode amplifier offered more control over tonal response and gain characteristics. And, third, it was presettable and could be easily switched between its solo and rhythm modes by footswitch action of the performer during live performances.

One drawback of the prior dual mode amplifier was its relative complexity and related expense, due to the particular arrangement and number of components required to form it. Thus, a hitherto unsolved need has arisen for an improved dual mode musical instrument preamplifier implemented with a streamlined circuit design which achieves superior results with fewer circuit elements and lower complexity and cost for implementation.

SUMMARY OF THE INVENTION WITH OBJECTS

A general object of the present invention is to provide a multi-mode preamplifier for a musical instrument such as electrical guitar which overcomes limitations and drawbacks of the prior art and which advances the state of the art.

A specific object of the present invention is to provide a selectable solo and rythym mode preamplifier having an efficient circuit design capable of superior performance characterics at low prime cost.

One more object of the present invention is to provide a dual mode preamplifier which provides saturation distortion signal processing characteristics for lead guitar performance and which provides more linear signal processing characteristics for rhythm guitar performance, which is readily and smoothly switched between each mode without unwanted noise or popping, and which provides a substantially equalized output amplitude for both characteristics.

An amplifier circuit is provided for enhancing sound generated by a musical instrument such as a guitar and which is converted into electrical signals. The amplifier circuit includes an input for receiving the electrical signals from the instrument. A passive input network is connected to the input, and a first preamplifier is connected to the passive input network and operates in one mode (rythym mode) for non-distortion amplification of the electrical signals and operates in another mode (lead or solo) for saturation distortion amplification of the electrical signals upon being overdriven. A second preamplifier may be provided and coupled to the output of the first preamplifier and it amplifies the output from the first preamplifier. An output terminal is connected to the output of the second preamplifier means and it includes an adjustable output attenuation network. A singly actuated switch enables an overdrive amplifier to be switchably connectable across the passive input network in response to operation of said switch for overdriving the first preamplifier thereby to cause saturation distortion amplification of the electrical signals. A shunt network may be switchably connectable across the output terminal in response to operation of the switch in order to reduce and equalize the output amplitude of the amplifier circuit when the overdrive amplifier is connected across the passive input network by operation of said switch means (in lead mode) with the output amplitude of the amplifier circuit when the overdrive amplifier is not connected across the input network (rhythm mode).

These and other objects, advantages and features of the present invention will become even more apparent to those skilled in the art upon consideration of the following detailed description of a preferred embodiment, presented in conjunction with the accompanying drawings:

BRIEF DESCRIPTION OF THE DRAWINGS

In the Drawings:

FIG. 1 is a block diagram of an amplifier circuit incorporating the principles of the present invention.

DETAILED DESCRIPTION OF A PREFERRED EMBODIMENT

Figure 2A:
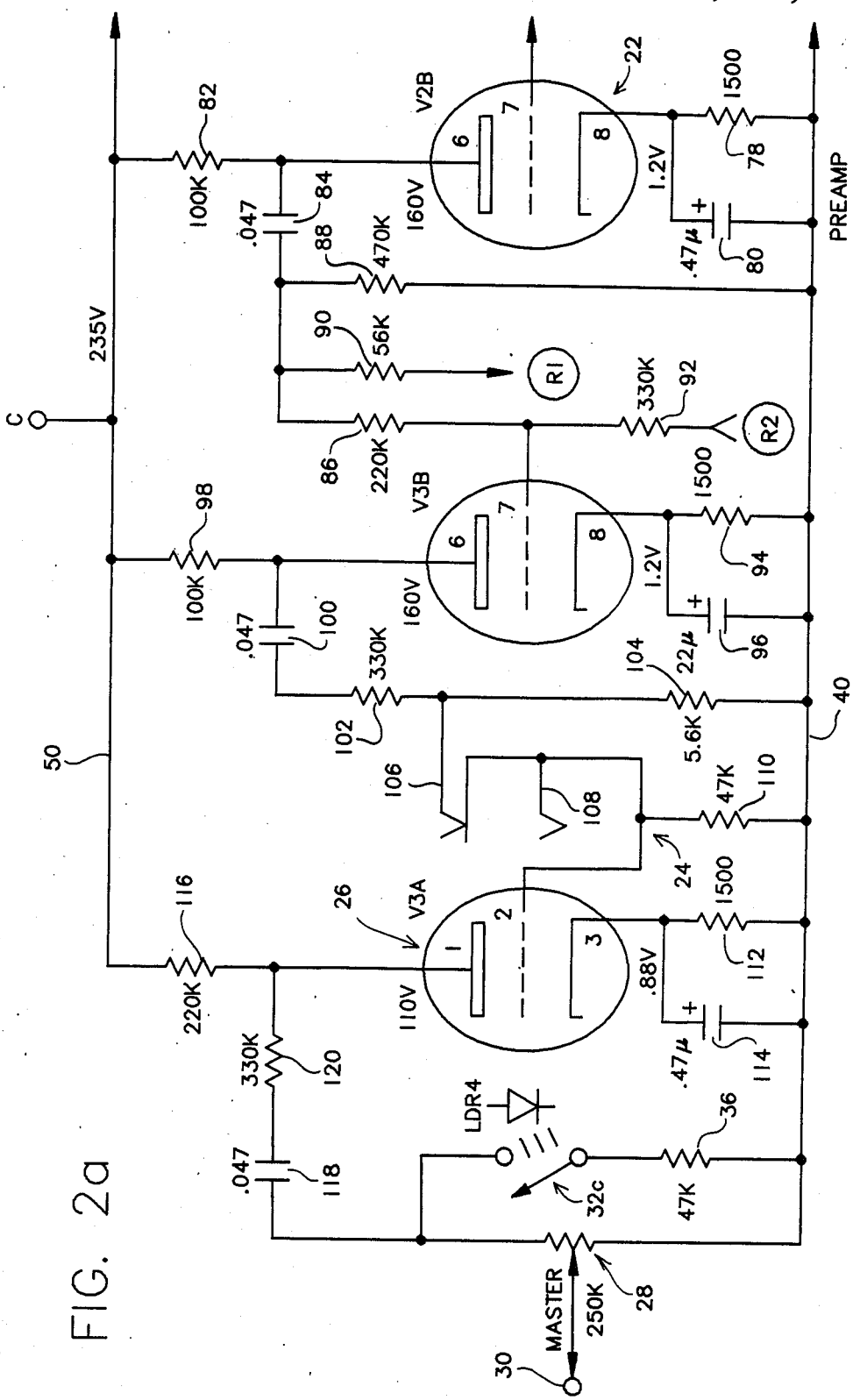
FIGS. 2a and 2b are a more detailed schematic circuit diagram of the amplifier circuit illustrated in FIG. 1.

With reference to FIG. 1, a dual mode preamplifier circuit 10 incorporating the principles of the present invention includes an input terminal 12 for receiving electrical signals picked up from a musical instrument, such as an electric guitar for example (not shown). These are typically very low level signals and are in need of preamplification and power amplification processing prior to being delivered to a loudspeaker (not shown) for practical reproduction, use and enjoyment during performance and play of the musical instrument.

An input attenuation pad network 14 is connected between the input terminal 12 and an input to a first (rhythm) preamplifier stage 16. Preferably, the input attenuation network 14 is fixed, but it may be made variable and may be adjustable either at the factory or by the user with a suitable control (not shown). A tone control network 18, a volume control 20, a tone control preamplifier 22, a special sound effects jack loop 24, an effects amplifier 26 and a master attenuator 28 having a wiper leading to an output terminal 30 complete the main path of the preamplifier circuit 10 illustrated in overview in FIG. 1.

Also present in the preamplifier circuit 10 is an overdrive or lead preamplifier 34 which is switchable across the input attentuation pad network 14 by actuation of a switch circuit 32 having an element 32a connected to the input terminal 12 and an element 32b connected to the input of the preamplifier 16. A third switch element 32c connects a fixed output attenuator 36 across the master attenuator 28 to reduce the output of the amplifier circuit 10 when the switch 32 is actuated. (Of course, a variable attenuator could be used in lieu of the fixed attenuator 36 with excellent results.) This third contact 32c and shunt network 36 enables the playing loudness to remain substantially equalized (or preadjusted) during both lead and rhythm modes of operation.

The input pad network 14 between the input terminal 12 and the rhythm preamplifier 16 includes a high value series resistor 15, a high frequency boost capacitor 17 and a shunt or grid leak resistor 19 to ground. This network 14 serves several important functions.

First, it raises the apparent headroom of the rhythm preamplifier stage 16. Second, through careful selection of values for the circuit components 15, 17 and 19 the network 14 enables the frequency response characteristics for rhythm mode operation to be tailored without affecting the characteristics for the solo or lead mode operation (when switch 32 is actuated). Third, it increases the apparent difference in gain between the rhythm and lead modes so that only a single triode lead overdrive preamplifier 34 is required. And, fourth, it prevents the input and output of the lead preamplifier 34 from being tightly coupled with resultant excessive negative feedback, while enabling use of a very simple shunt switching arrangement for connecting the lead preamplifier 34 into the main signal path of the preamplifier circuit 10. In order to provide the requisite input-/output isolation for the lead preamplifier 34, the value of a series resistor 15 of the network 14 across which the lead preamplifier 34 is shunted lies in a range of from no less than about 200K ohms to 3.3 Megohms. With a 3.3 Megohm series resistor in the network 14, high frequency rolloff is compensated for by the small value shunt capacitor 17.

The rhythm preamplifier stage 16 may then be conventionally configured with its output connected through the tone control network 18 to the gain or "volume" control 20.

The lead preamplifier 34 is configured as a high gain amplification stage whose large output signal, when coupled to the input of the rhythm preamplifier stage 16 by switch contact 32b, drives the stage 16 into saturation distortion. Values for the components used to form the lead preamplifier stage 34 are carefully selected in order to produce the desired musical distortion characteristics obtained by overdriving the rhythm preamplifier stage 16. The quality of lead mode sound may be enhanced by producing the overdrive saturation distortion early in the electronic signals processing path as at preamplifier 16 and then coupling the distorted signal through the tone control network 18.

A very simple shunt switch arrangement of the switch 32 provides dual mode control for the preamplifier 10. In order to maintain uniform playing loudness in both modes (while providing vastly differning tonal characteristics in each mode), the output fixed attenuator 36 (or adjustable attenuator) is simultaneously switched across the master control 28 by the switch contact 32c whenever the switch 32 is activated.

The use of dual attenuators 20 and 28 provides a surprising margin of independent adjustment for each operating mode. The input attenuation pad 14 reduces the single level in the rhythm mode, so that the overload effect of increasing the volume control 20 upon subsequent amplification stages is very gradual over a large percentage of its total adjustment range. Increases in loudness produced by turning up the volume control 20 may be counteracted by turning down the master control 28 at the end of the signal processing path.

Specifically, the input pad 14 prevents saturation (overload) from occuring in the rhythm mode until it is desirable, i.e. when the volume control 20 is nearly fully advanced to full setting. (Sometimes guitarists desire a somewhat distorted rhythm response rather than one which is sparkling clean or perfectly linear). Thus, when a high amplitude signal level is passed by the volume control 20 into the amplifier 22, it, too, may begin to amplify with distortion saturation, and this distortion tends to cascade through any subsequent amplifier stages.

At low settings of the volume control 20, the rhythm mode remains very linear and "clean" whereas in the lead mode the onset of saturation distortion is barely perceptible. At moderate settings of the volume control 20, the rhythm mode remains clean while the lead mode produces substantial distortion. At high amplitude settings of the volume control 20 the rhythm mode approaches the maximum of its linear or clean operation while the lead mode experiences very intense saturation. At a maximum setting of the volume control 20, the rhythm mode now enters substantial, perceptible overdrive, while distortion produced in the lead mode is extreme.

Meanwhile, the actual playing loudness put out by the amplifier 10 is adjustable at the master control 28 which controls the signal amplitude put out by the preamplifier 10 to a suitable power amplifier (not shown). Because the additional gain supplied by the lead overdrive preamplifier 34 is constant (and is preferably not user adjustable) a simple fixed attenuator 36 shunted across the master control by action of switch contact 32c is sufficient for maintaining loudness equivalency when switching from the rhythm mode to the lead mode.

Where front panel layout permits, an adjustable attenuator may be used in place of the simple fixed attenuator 36, but its actual usefulness is not completely clear. (Some musicians may wish to vary amplitude levels between rhythm and lead, and a variable attenuator for the attenuator 36 enables such variation to be made.) Most musicians have been found to want equal loudness in both modes, and the tracking accuracy of the fixed pad 36 with input signal amplitude from the guitar is quite uniform over a large range of control settings, thereby obviating the need to adjust two separate master controls.

The effects loop send and return arrangement 24 is provided so that special effects from external circuitry, such as digital delay, wah-wah circuits, etc., may receive the overdriven lead mode signal at a suitable low level (e.g. 0.3 volt RMS) and thereupon process the composite signal (whether rhythm mode or lead mode) and return it to the main path of the preamplifier 10, typically at unity gain. This feature is not desirable, since most external special effects circuits and appliances are intended for insertion between the musical instrument itself and the amplification chain. Such insertion would prevent the special effects appliances from processing the overdriven distortion component of the lead mode signal, and the result is musically unpleasing. The effects preamplifier 26 maintains unity gain and overcomes any losses introduced in the effects loop.

Figure 2B:
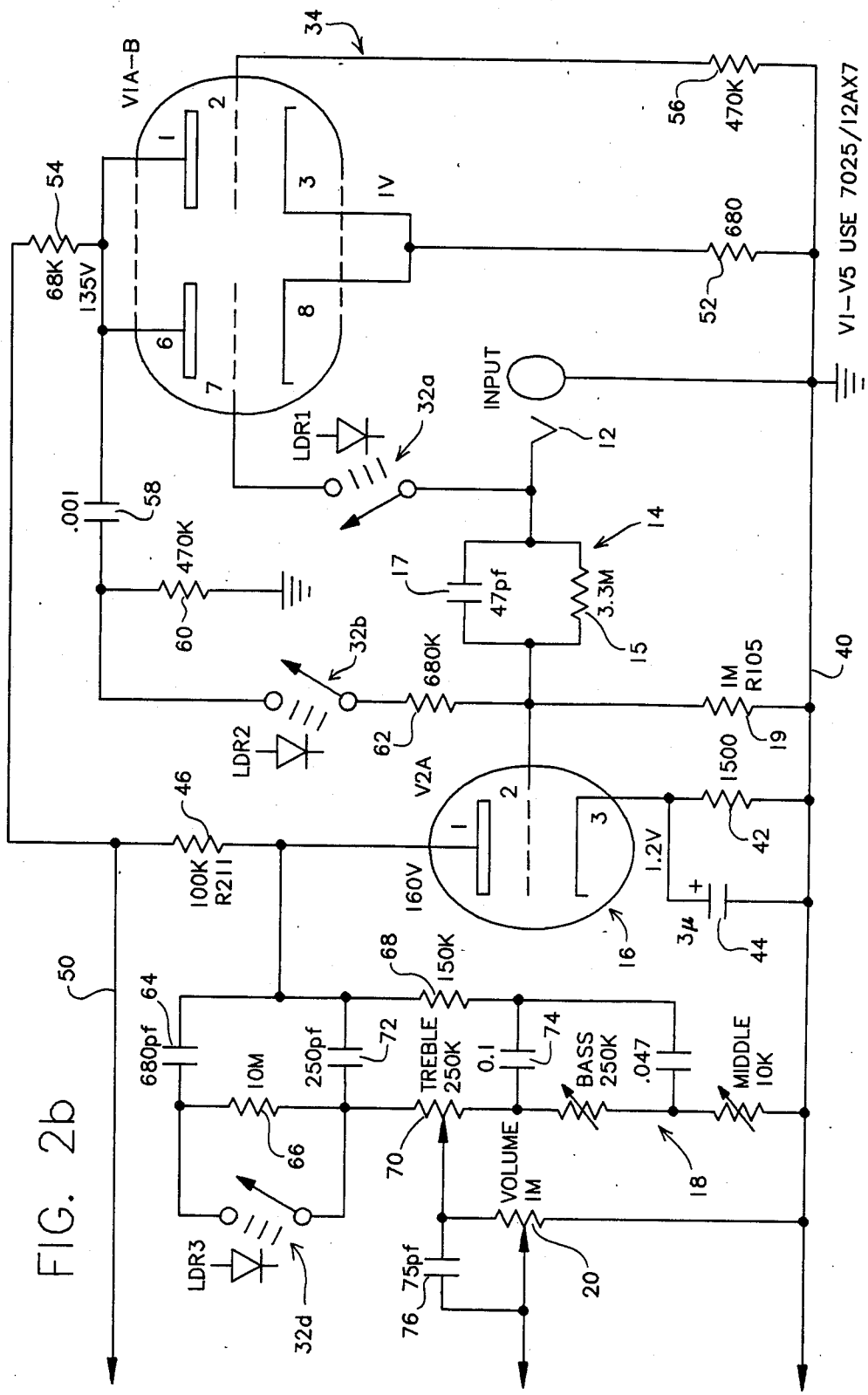

With reference to the more detailed FIG. 2 schematic, the shielded input jack 112 receives low level electrical signals induced in an electric guitar reluctance pickup, for example. The shunt resistor 19 functions both as the shunt element of the pad 14 and as the grid leak resistor for the grid of triode V2A, which provides the rhythm preamplifier 16. The cathode of V2A is biased by a resistor 42 and bypassed by a capacitor 44, both being connected to a ground bus 40. The plate of V2A uses a load resistor 46 which is connected to a high voltage supply rail 50.

The lead preamplifier 34 is implemented as two triodes V1A and B connected in parallel. While it has been found that this parallel triode arrangement achieves a lower noise figure, it is to be understood that a satisfactory circuit may be realized with a single electron discharge device. The parallel cathodes of V1A-B are biased by a resistor 52 to ground 40. A load resistor 54 extends from the plates of V1A-B to the high voltage rail 50; and, the grids of V1A-B are held at ground by grid leak resistor 56. The lead preamplifier 34 operates as a conventional high gain triode amplifier, and when the lead mode is selected, a "soft" switch circuit comprising switching element 32a connects the grids to the input terminal 12, and switching element 32b connects the amplified signal from the plate through a blocking capacitor 58 to the grid of the rhythm preamplifier 16 triode V2A. Resistors 60 and 62 load the blocking capacitor 58 and adjust the signal level respectively, as applied to the V2A grid. The switching elements 32a and 32b (and 32c for that matter) are preferably implemented as light dependent resistors (LDR). These devices switch smoothly from a very high resistance to a very low resistance in the presence of light energy. Thus, any unwanted pop or noise associated with conventional electrical contacts is completely avoided. A single switched power source commonly energizes the light sources of the elements 32a, 32b, 32c, etc., so that they uniformly close when light is generated at each element.

It will be apparent to those skilled in the art that the difference in signal amplitude as applied to the grid of V2A (the rhythm preamplifier 16) is orders of magnitude greater in the lead mode than in the rhythm mode, since the rhythm mode electrical signal reaching the grid is first attenuated to less than half of its original amplitude by the resistor 15, while the lead mode electrical signal reaching the same grid is first amplified by the high grain triode V1A-B before being coupled to the V2A grid. Therefore, in the lead mode, rhythm preamplifier 16 triode V2A may be driven well beyond the linear portion of its operating characateristic, and this large magnitude signal, rich in distortion harmonics, cascades further through the main signal path of the preamplifier 10, causing each subsequent amplifier stage to be driven into saturation. In the rhythm mode, however, at all but the highest amplitude control settings, the signal amplitude and gain characteristics of each amplifier stage of the preamplifier 10, and coupling networks therebetween, are arranged to maintain linear, non-distorted operation.

The rhythm reamplifier stage 16 is followed by a tone control network 18 configured as shown in FIG. 2. The output of the tone control network 18 (which introduces a substantial insertion loss into the main signal path) is coupled to the grid of the tone control preamplifier 22, through the volume control 20. An additional capacitor 64 is coupled into the treble section of the tone control network 18 during lead mode by operation of switch elemente 32d. This additional capacitance lowers the center of the treble section passband to include a large portion of the upper audio midrange. This feature substantially alters the tonal characteristics and contributes additional signal amplitude to the output of the tone control network 18. A resistor 66 prevents static charge from accumulating in the capacitor 64 which would otherwise create an audible "pop" when switching to lead mode.

Another resistor 68 of the network 18 distributes signal into the base/midrange portion of the tone control network 18 and attenuates its amplitude to better balance signal level in the treble region. The output of the tone control network is derived from the adjustable wiper element of a treble control 70. At one end of its rotation the wiper receives signal directly from a treble capacitor 72, while at the other end of rotation signal is obtained directly from a bass capacitor 74. Settings of the wiper of the control 70 anywhere between the limits of rotation receive a proportional balance of treble and bass signal components from the network 18.

Composite output signal from the treble control 70 is attenuated by the volume control 20, whose wiper is connected to the grid of the tone control preamplifier 22, implemented as the vacuum triode V2B. A capacitor 76 restores high frequency components lost across the volume control 20. The triode V2B is configured as a high gain triode amplifier whose cathode is biased by a resistor 78 and bypassed by a capacitor 80. Amplified signal at the plate of V2B appears across a load resistor 82 leading to the high voltage rail 50.

A blocking capacitor 84 blocks D.C. voltage while coupling the amplified signals through a series resistor 86 to a grid of an additional preamplifier stage formed by triode V3B. A resistor 88 acts as a grid leak for the grid of V3B. Resistoros 90 and 92 offer send and receive ports (R1) and (R2) for a built in accessory such as a reverberation circuit (not shown). V3B is configured as a conventional high gain triode amplifier whose cathode is biased by a resistor 94 and bypassed by a bypass capacitor 96. The plate anode of the V3B triode develops its amplified output across a load resistor 98 which extends to the high voltage rail 50. The amplified signal from the plate of V3B is coupled through a coupling capacitor 100 to an attenuation pad comprising resistors 102 and 104 the purpose of which is to provide a low impedance signal of amplitude appropriate for matching outboard accessory devices via the effects loop 24.

As already mentioned, various outboard special effects devices, such as digital delay lines, etc., may be coupled into the main signal path of the preamplifier 10 by virtue of the special effects loop jack circuit 24. This circuit 24 includes two jacks 106, 108. The jack 106 includes a bridging contact which connects to the jack 108 in the absence of insertion of a plug into the jack 106.

A resistor 110 provides a grid leak path for the special effects preamplifier 26, implemented in the FIG. 2 embodiment as a high gain amplifier triode V3A. This final amplifier V3A puts out a signal having sufficient amplitude to drive a power amplifier. Its cathode is biased by a resistor 112 and is bypassed by a capacitor 114. The plate electrode of the triode V3A develops amplified output across a load resistor 116 leading to the high voltage rail 50. This output is coupled through a D.C. blocking capacitor 118 and a resistor 120 to the master or output attenuator 28.

A switch element 32c such as a light dependent resistor is synchronized to be actuated with elements 32a, 32b and 32d whenever lead mode is selected. This switch element 32c connects the fixed resistor 36 across the output attenuator 28 so as to establish and maintain automatic loudness equivalency between both the rhythm and lead modes of the preamplifier 10. As mentioned earlier, an adjustable attenuator may be substituted for the fixed resistor 36. As a practical matter, the availability of control panel space has been a determining factor as to how many additional controls including an adjustable attenuator may be provided for use with the preamplifier 10. Adjustable level ouput is then derived from the wiper of the master control 28 and coupled directly to the output terminal 30.

An equalization circuit such as a graphic equalizer may be included between the output terminal 30 and the power amplifier, loudspeaker combination driven by the dual mode preamplifier 10.

To those skilled in the art to which this invention pertains many widely varying embodiments and applications will be readily suggested by the foregoing description of a preferred embodiment without departure from the spirit of the present invention. For example, solid state amplification and signal processing devices may be substituted for the vacuum tube preamplifiers in a known manner which will achieve substantially identical saturation distortion signal processing characteristics. The description provided herein is intended to be illustrative and not limiting of the present invention, the scope of which is more particularly set forth in the claims appended hereto.

I claim:

1. A preamplifier circuit for enhancing sound generated by a musical instrument such as a guitar and which is converted into electrical signals comprising:
   an input for receiving said electrical signals,
   a passive high impedance input network connected to said input,
   first preamplifier means connected to said passive input network for non-distortion amplification of said electrical signals in a first mode of operation and capable of saturation distortion amplification of said electrical signals upon being overdriven in a second mode of operation,
   an output terminal connected to the output of the first preamplifier means and including an output attenuation network,
   commonly actuated switch means for switching between said first mode of operation and said second mode of operation,
   overdrive amplifier means connectable to bridge across said passive input network in response to said switch means for overdriving said first preamplifier thereby to cause saturation distortion amplification of said electrical signals, and
   shunt network means switchably connectable across said output terminal in response to said switch means thereby to equalize output amplitude of said preamplifier circuit between said first and said second modes of operation.

2. The preamplifier circuit set forth in claim 1 further comprising second preamplifier means coupled to the output of the first preamplifier stage for non-distortion amplification of the output from the first preamplifier means in the first mode of operation and for saturation distortion amplification by cascade effect of the output from the first preamplifier means in the second mode of operation, and wherein the output terminal is connected to the output of the second preamplifier means.

3. The preamplifier circuit set forth in claim 2 wherein said first preamplifier means, said second preamplifier means and said overdrive amplifier means each include vacuum tube triode high gain amplification stages.

4. The preamplifier circuit set forth in claim 2 further including an effects loop in said second preamplifier means for enabling insertion of low level special effects processing of said electrical signals downstream of saturation distortion processing thereof.

5. The preamplifier circuit set forth in claim 1 wherein said passive high impedance input network connected to said input includes a resistance element between said input and said first preamplifier means having a value lying substantially within a range between 200,000 ohms and ten megohms.

6. The preamplifier circuit set forth in claim 1 wherein said ouput attenuation network includes a variable attenuator for adjusting output level from said preamplifier circuit.

7. The preamplifier circuit set forth in claim 2 wherein said second preamplifier means includes adjustable volume control means for controlling amplitude from said first preamplifier means in a manner which enables some saturation distortion processing of said electronic signals in said first mode when said volume control means is set to pass maximum amplitude.

8. The preamplifier circuit set forth in claim 2 wherein said second preamplifier means comprises a plurality of amplification stages arranged in cascade, with signal attenuation means located between each said stage.

* * * * *